United States Patent
Roters et al.

(10) Patent No.: US 7,144,826 B2
(45) Date of Patent: Dec. 5, 2006

(54) METHOD AND APPARATUS FOR THE PRODUCTION OF PROCESS GAS THAT INCLUDES WATER VAPOR AND HYDROGEN FORMED BY BURNING OXYGEN IN A HYDROGEN-RICH ENVIRONMENT

(75) Inventors: Georg Roters, Dümen (DE); Roland Mader, Altusried (DE); Helmut Sommer, Deggingen (DE); Genrih Erlikh, Daly City, CA (US); Yehuda Pashut, San Jose, CA (US)

(73) Assignee: Mattson Thermal Products (DE)

( * ) Notice: Subject to any disclaimer, the term of this patent is extended or adjusted under 35 U.S.C. 154(b) by 139 days.

(21) Appl. No.: 10/476,136

(22) PCT Filed: Apr. 19, 2002

(86) PCT No.: PCT/EP02/04345

§ 371 (c)(1),
(2), (4) Date: Feb. 2, 2004

(87) PCT Pub. No.: WO02/086958

PCT Pub. Date: Oct. 31, 2002

(65) Prior Publication Data

US 2004/0137754 A1    Jul. 15, 2004

(30) Foreign Application Priority Data

Apr. 23, 2001 (DE) ................................ 101 19 741

(51) Int. Cl.
*H01L 21/473* (2006.01)
*C23C 16/00* (2006.01)

(52) U.S. Cl. ...................................... 438/773; 118/719

(58) Field of Classification Search ................. 438/773
See application file for complete search history.

(56) References Cited

U.S. PATENT DOCUMENTS

| | | | |
|---|---|---|---|
| 3,630,956 A | 12/1971 | Benning et al. | |
| 5,082,606 A | 1/1992 | Rotman et al. | |
| 5,257,926 A | 11/1993 | Drimer et al. | |
| 5,462,014 A * | 10/1995 | Awaya et al. | 118/725 |
| 5,633,212 A * | 5/1997 | Yuuki | 438/773 |
| 6,114,258 A * | 9/2000 | Miner et al. | 438/787 |
| 6,372,663 B1 * | 4/2002 | Yeh et al. | 438/773 |
| 2001/0019902 A1 * | 9/2001 | Inokuchi et al. | 438/773 |
| 2004/0137755 A1 * | 7/2004 | Herring et al. | 438/770 |

FOREIGN PATENT DOCUMENTS

| | | |
|---|---|---|
| DE | 2 411 006 | 9/1974 |
| DE | 31 43 050 | 5/1983 |
| DE | 38 09 367 | 9/1989 |
| EP | 0 307 621 | 3/1989 |
| EP | 0 922 667 | 6/1999 |
| JP | 57-194522 A | 11/1982 |
| JP | 9-20501 A | 1/1997 |

* cited by examiner

Primary Examiner—Stephen W. Smoot
(74) Attorney, Agent, or Firm—Dority & Manning P.A.

(57) ABSTRACT

The aim of the invention is the simple and economical production of a hydrogen-rich process gas from water vapour and hydrogen, whereby the proportion of water vapour to hydrogen may be precisely controllable and reproducible. Said aim is achieved, with a method and device for the production of a process gas for the treatment of substrates, in particular semiconductor substrates, in which the oxygen for formation of a process gas, comprising water vapour and hydrogen, is burnt in a hydrogen-rich environment in a combustion chamber.

28 Claims, 2 Drawing Sheets

METHOD AND APPARATUS FOR THE PRODUCTION OF PROCESS GAS THAT INCLUDES WATER VAPOR AND HYDROGEN FORMED BY BURNING OXYGEN IN A HYDROGEN-RICH ENVIRONMENT

BACKGROUND OF THE INVENTION

The present invention relates to a method and an apparatus for the production of a process gas for the treatment of substrates, especially semiconductor substrates.

Computer chips, as well as other electronic components, are manufactured on semiconductor disks, so-called wafers. For this purpose, many operating steps and processes are necessary, such as, for example, structuring, lithography, ion implantation, etching or coating. Coating processes are frequently carried out during a thermal treatment of the wafers in a prescribed process gas atmosphere. In this connection, it is known to use a process gas comprising water vapor and oxygen for an oxygen-rich wet oxidation of the wafers. The oxygen-rich process gas is particularly suitable for building up thick oxide layers of 2000 angstroms at low thermal budget, as well as for the production of thin gate-oxides having a layer thickness of less than approximately 40 angstroms. Furthermore, a hydrogen-rich wet oxidation is known according to which the process gas comprises water vapor and hydrogen. The hydrogen-rich process gas is particularly suitable for the selective oxidation of gate-stacks with metal gates or metal gate contacts.

For the production of the oxygen-rich process gas and of the hydrogen-rich process gas (i.e. a process gas comprising water vapor and oxygen or hydrogen), different methods were used in the past.

The oxygen-rich process gas was, for example, produced in a burner having a combustion chamber in which oxygen and hydrogen were burned to produce water vapor. For the combustion, more oxygen was always made available than could be burned with the hydrogen. In this way, there resulted an excess of oxygen, so that a process gas comprising water vapor and oxygen was formed. This process gas was subsequently conveyed via an appropriate conduit into a process chamber for the treatment of a semiconductor wafer. Additional oxygen could be introduced into the conduit in order to establish the oxygen content in the process gas.

For the production of a hydrogen-rich process gas, in the past hydrogen gas was mixed with water vapor, whereby the water vapor was produced by the evaporation of distilled water. However, this method does not permit high gas flows. Furthermore, the ratio of water vapor and hydrogen cannot be precisely controlled and reproduced. A further drawback of this method is that contaminations frequently occur.

Proceeding from the known state of the art, it is therefore an object of the present invention to provide a method and an apparatus which, in a straightforward and economical manner, enable the production of a hydrogen-rich process gas comprising water vapor and hydrogen, whereby the mixture ratio of water vapor and hydrogen can be precisely controlled and reproduced.

SUMMARY OF THE INVENTION

Pursuant to the invention, this object is realized with a method for the production of a process gas for the treatment of substrates, especially semiconductor substrates, in that oxygen for the formation of a process gas comprising water vapor and hydrogen is burned in a hydrogen-rich environment in a combustion chamber. With this method, high gas flows from the process gas can be achieved. Furthermore, the ratio between water vapor and hydrogen can be precisely controlled and reproduced, since the quantity of the resulting water vapor is directly proportional to the oxygen that is introduced and burned with the hydrogen. Furthermore, pure hydrogen results during the combustion, so that the process gas has a high purity.

Instead of oxygen, in general, an oxygen-containing gas, such as, for example, NO or $O_3$, can be used, and similarly in place of hydrogen a gas containing hydrogen or a hydrogen isotope, such as, for example, $NH_3$, deuterium, or $NO_3$, can be used.

To ensure that all of the oxygen in the combustion chamber is burned, the presence of unburned oxygen is detected downstream of the combustion chamber. If unburned oxygen is detected downstream of the combustion chamber, pursuant to one embodiment of the invention the method is interrupted, since the unburned oxygen can form an oxyhydrogen gas or an explosive gas mixture with the hydrogen that is present in the process gas. For this reason, preferably an inert gas is also introduced into the process gas if unburned oxygen is detected downstream of the combustion chamber in order to prevent the danger of the formation of oxyhydrogen or explosive gas downstream of the combustion chamber.

Pursuant to one preferred embodiment of the invention, hydrogen is introduced into the process gas downstream of the combustion chamber, as a result of which the hydrogen concentration in the process gas can be established as desired. The ratio of hydrogen to water vapor is preferably set between the stoichiometric combustion (0% $H_2$) and 1000/1 (0.1% $H_2O$).

The combustion chamber is advantageously filled with pure hydrogen prior to the combustion of oxygen, and oxygen is first introduced for triggering the combustion, in order to prevent oxyhydrogen or explosive gas from forming in the combustion chamber which after the triggering of the combustion is not completely burned and exits the combustion chamber. Prior to the filling with hydrogen, the combustion chamber and/or the downstream gas system is advantageously flushed with inert gas (for example $N_2$, He or Ar) in order to remove possible atmospheric oxygen.

For the production of an oxygen-rich process gas in the same unit, the ratio of oxygen to hydrogen in the combustion chamber is preferably changed during the combustion. In this way, in a straightforward and economical manner, it is possible to change from a hydrogen-rich process gas to an oxygen-rich process gas to the extent that this is desired for a subsequent process. Furthermore, in this way, using the same apparatus, different processes can be enhanced in subsequent apparatus, for example separate rapid heating units or in general units for the thermal treatment of substrates (semiconductors). To ensure that during the change between the production a hydrogen-rich and an oxygen-rich process gas no oxyhydrogen or explosive gases are produced, a stoichiometric combustion of oxygen and hydrogen is carried out for a predetermined period of time. Due to the stoichiometric combustion, the previous excess hydrogen is displaced from the chamber by the resulting water vapor. Only after all of the hydrogen is displaced, is the oxygen content again increased in order to provide an oxygen-rich combustion. In this way, it is ensured that no oxyhydrogen or explosive gases are formed in the combustion chamber and/or in downstream gas systems, such as, for example, the process chamber of rapid heating units. In this connection, for safety reasons the concentration of unburned oxygen and/or hydrogen can be monitored, thereby ensuring that a possible oxygen/hydrogen mixture is below the explosion limit, which is a function of pressure, temperature and further parameters (such as, for example, UV irradiation).

For a precise setting of the oxygen concentration in the oxygen-rich process gas, additional oxygen is preferably introduced downstream of the combustion chamber. The ratio of oxygen to hydrogen is preferably between 0% (complete combustion or 100% $H_2O$) and 100% (0.1% $H_2O$).

To prevent a production of oxyhydrogen or explosive gas in the conduit that is disposed downstream of the combustion chamber, an oxygen supply line is blocked downstream of the combustion chamber if a hydrogen-rich process gas is produced in the combustion chamber. In the same manner, a hydrogen supply line is preferably blocked downstream of the combustion chamber if an oxygen-rich process gas is produced in the combustion chamber. Furthermore, the hydrogen supply line and the oxygen supply line are engaged in opposition to one another, i.e. always only one of the two supply lines is open. For a changing of the process gas, a further fluid is preferably introduced into the process gas downstream of the combustion chamber in order to be able to enhance different mechanisms during the subsequent substrate treatment. The further fluid can be a gas that is reactive or inert for the subsequent thermal process for processing semiconductor wafers, or can be a mixture of such gases (e.g. Ar, $N_2$).

Pursuant to one embodiment of the invention, an oxygen-rich process gas is first produced in the combustion chamber in that oxygen is burned in a hydrogen-poor environment, and subsequently the ratio of hydrogen to oxygen in the combustion chamber is changed for the combustion of oxygen in a hydrogen-rich environment. Thus, it is possible to selectively start with the production of a hydrogen-rich or oxygen-rich process gas, and subsequently it is possible to change as desired between the production of these two process gases without having to shut the burner down.

If an oxygen-rich combustion is effected in the combustion chamber, the method is preferably interrupted and/or an inert gas is introduced into the process gas if downstream of the combustion chamber unburned hydrogen is detected by a device for detecting hydrogen (e.g. a hydrogen sensor). In this way, the formation of an oxyhydrogen gas explosive gas mixture downstream of the combustion chamber is prevented.

When changing from a combustion of oxygen in a hydrogen-poor environment to a hydrogen-rich environment, for a predetermined period of time a stochiometric combustion of oxygen and hydrogen is preferably carried out in order to ensure that the combustion chamber contains only water vapor and no unburned oxygen or hydrogen.

To prevent the formation of oxyhydrogen or explosive gases, the combustion chamber is preferably rinsed with an inert gas prior to the combustion process.

Pursuant to one embodiment of the invention, the process gas is preferably used for the thermal treatment of at least one semiconductor wafer or semiconductor material, and within a treatment cycle is changed between a hydrogen-rich and an oxygen-rich process gas. The term treatment cycle is intended to mean that the semiconductor (e.g. semiconductor wafer) is subjected to a temperature-time cycle that includes at least a heating-up and a cooling-off of the semiconductor. The semiconductor, which is generally in substrate form, can include Si and can be a III–V, II–VI, or IV—IV semiconductor.

Pursuant to an alternative embodiment, the process gas is used for the thermal treatment of at least one semiconductor wafer, and during successive thermal treatment cycles a change is made between a hydrogen-rich and an oxygen-rich process gas. During a thermal treatment cycle, the concentration of hydrogen or oxygen in the water vapor of the process gas is preferably changed.

The object of the invention is also realized by an apparatus for the production of a process gas for the treatment of substrates, especially semiconductor substrates, which apparatus has a burner with a combustion chamber, at least one oxygen supply line and at least one hydrogen supply line into the combustion chamber, an ignition unit for igniting an oxygen/hydrogen mixture in the combustion chamber, and a control unit, which is controllable is such a way that for the formation of a process gas comprising water vapor and hydrogen, the oxygen is ignited in a hydrogen-rich environment and is completely burned. The apparatus has the advantages that were already mentioned above.

BRIEF DESCRIPTION OF THE DRAWINGS

The invention will be explained subsequently with the aid of preferred embodiments with reference to the drawings; shown in the drawings.

DESCRIPTION OF PREFERRED EMBODIMENTS

Figure 1:
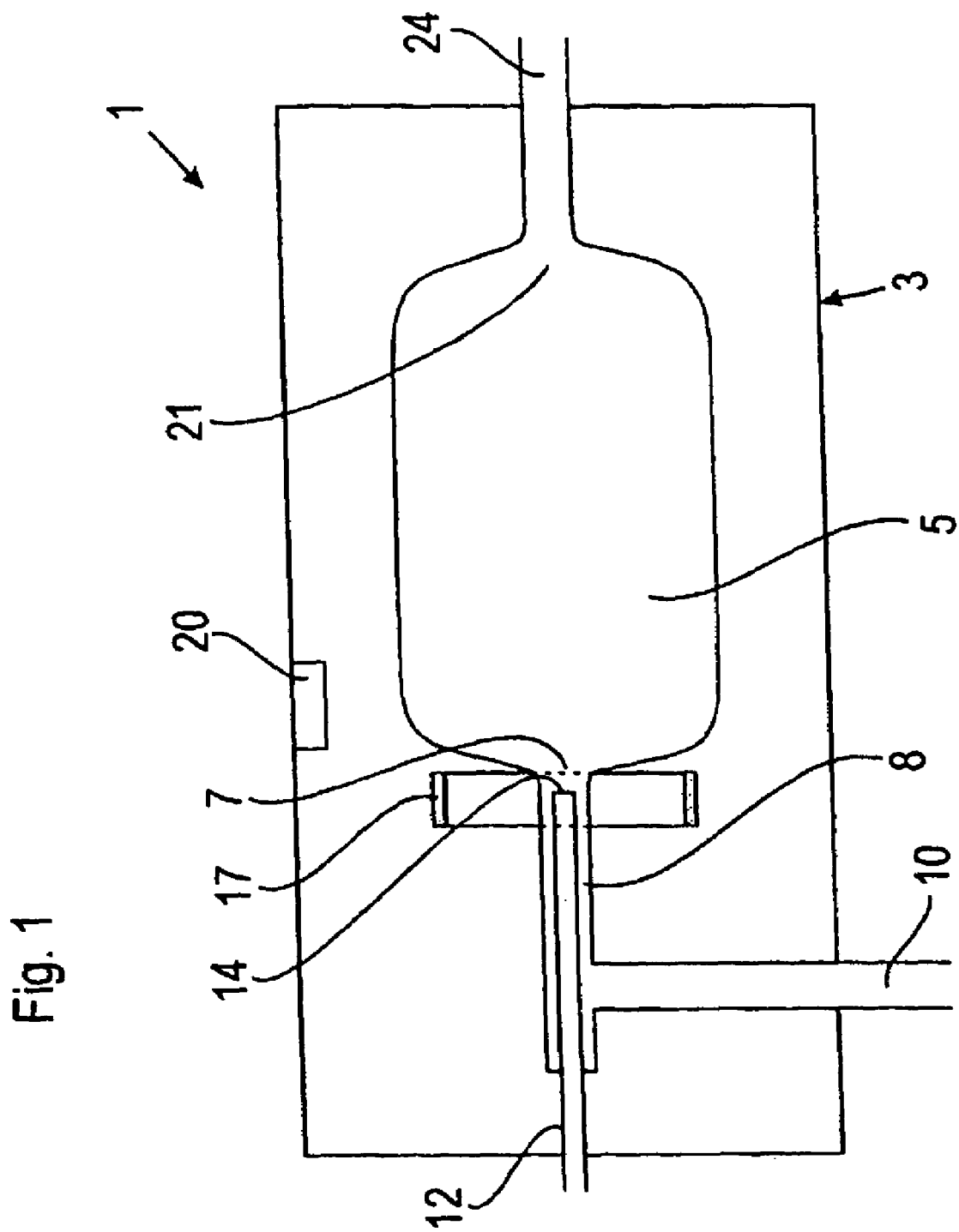
FIG. 1 a schematic cross-sectional illustration through a burner.

FIG. 1 shows a schematic illustration of a burner 1 in which, pursuant to the inventive method, oxygen and hydrogen are burned to form a gas that contains water vapor.

The burner 1 is provided with a housing 3 that in the interior includes a combustion chamber 5. The combustion chamber 5 has an inlet 7 that is in communication with a first gas inlet line 8. The first gas inlet line 8 is in communication with a supply line 10 via which, as will be explained in greater detail subsequently, hydrogen is introduced into the burner 1.

In the region of the first gas inlet line 8, a second gas inlet line 12 is also provided. The second gas inlet line 12 extends at least partially in the first gas inlet line 8, and is embodied as a so-called lance. By means of the second gas inlet, as will be explained in greater detail subsequently, oxygen is introduced into the burner 1. The second inlet line 12 has an outlet end 14 that is disposed in the region of the first inlet line 8, so that a mixing of the gases introduced via the two inlet lines 8,12 is already effected in the region of the first inlet line 8, before the mixture enters into the combustion chamber.

The region of the first inlet line 8, into which the second inlet line 12 opens, is surrounded by a heating ring 17 in order to heat the resulting oxygen/hydrogen gas mixture in this region above its ignition temperature, and to ignite it. Alternatively, some other device can also be provided for the ignition of the mixture.

Furthermore provided in the housing 3 of the burner 1 is a UV detector 20, which is directed toward a combustion region of the oxygen/hydrogen gas mixture in order to monitor the burning process. Since oxygen and hydrogen burn with a visible flame, the UV detector can monitor the combustion process at a measurement range of 260 nm. The UV detector is coupled with an appropriate control device that stops the supply of gas via the inlet lines 8 and 12 when the detector determines that the flame is extinguished.

The combustion chamber 5 also has an outlet end 21 that communicates with an outlet conduit 24 which, as will be explained in greater detail subsequently with reference to FIG. 2, communicates with a rapid heating unit or in general a process chamber for the thermal treatment of semiconductors.

Provided in the outlet conduit 24 is a non-illustrated oxygen and hydrogen sensor, or an appropriate detection device, in order to detect unburned oxygen or unburned hydrogen in the conduit 24.

Figure 2:
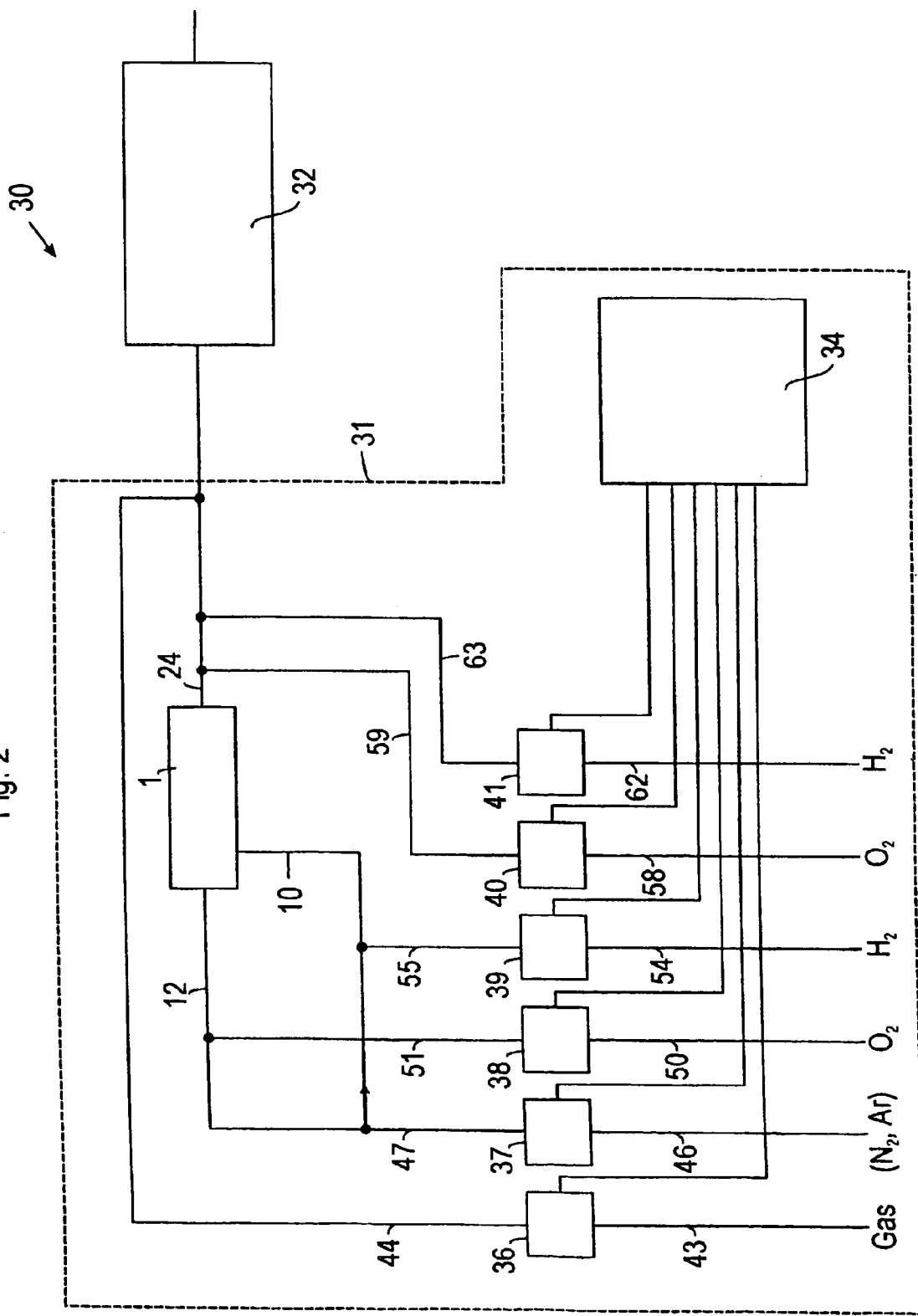
FIG. 2 a schematic block diagram of a substrate treatment apparatus into which is integrated a device for the production of a process gas pursuant to the present invention.

FIG. 2 shows a schematic block diagram of an apparatus 30 for the treatment of semiconductor wafers; the burner 1 of FIG. 1 is integrated into this apparatus.

The apparatus 30 has a process gas production portion 31 and, for example, a rapid heating unit 32 in which at least one semiconductor wafer is disposed and is thermally treated. The rapid heating unit 32 has, for example, a construction such as is known from DE-A-199 05 524, which originates with the same applicant and to this extent is made the subject matter of the present invention in order to avoid repetition. The outlet conduit 24 of the burner 1 communicates with an inlet of a process chamber of the rapid heating unit 32 in order to be able to convey process gases, which are produced in the burner 1, into the rapid heating unit.

The process gas production portion 31 of the apparatus 30 includes the burner 1, an electronic control unit 34, as well as a plurality of mass flow controllers or gas flow control units 36 to 41, which are each controlled by the control unit 34 to provide a controlled gas flow therethrough.

The mass flow controller 36 has a gas supply line 43 as well as an outlet line 44. The supply line 43 is in communication with a gas source. The outlet line 44 is in communication with the conduit 24 between the burner 1 and the rapid heating unit 32 in order to introduce an additional gas into the process gas produced in the burner 1, which gas is required in the subsequent process.

The mass flow controller 37 has a supply line 46 as well as an outlet line 47. The supply line 46 is in communication with a source of an inert gas, such as nitrogen or argon. The outlet line 47 is in communication with the supply line 10 of the first inlet line 8 of the burner 1, as well as with the second inlet line 12 of the burner 1.

The mass flow controller 38 has a supply line 50 as well as an outlet line 51. The supply line 50 is in communication with an oxygen source or with a source for some other oxygen-containing gas, while the outlet line 51 is in communication with the second inlet line 12 of the burner 1.

The mass flow controller 39 has an inlet line 54 that is in communication with a hydrogen source or with a source for some other hydrogen-containing gas, as well as an outlet line 55, which is in communication with the supply line 10.

The mass flow controller 40 communicates with an inlet line 58 as well as with an outlet line 59. The supply line 58 is connected with an oxygen source or with a source for some other oxygen-containing gas, while the outlet line 59 is in communication with the conduit 24 between the burner 1 and the rapid heating unit 32.

The mass flow controller 41 again has a supply line 62 as well as an outlet line 63. The supply line 62 is in communication with a hydrogen source or with a source for some other hydrogen-containing gas, while the outlet line 63 is in communication with the conduit 24 between the burner 1 and the rapid heating unit 32.

As mentioned previously, the mass-flow controllers 36 to 41 are controlled by the control unit 34 so that they either convey controlled quantities of gas from their respective supply lines to their respective outlet lines, or they are closed.

The function of the process gas production portion 31, and an inventive method for operating the same, will be explained in greater detail subsequently with reference to FIGS. 1 and 2.

Prior to the production of a process gas, all of the mass flow controllers 36 to 41 are initially closed. Subsequently, the mass flow controller 37 is actuated in order to introduce an inert gas into the burner 1 via the supply line 10 as well as the second inlet line 12. In this way, the supply lines 10, 12, the burner 1, as well as the outlet conduit 24 and possibly the process chamber of the rapid heating unit 32 are flushed with inert gas to ensure that no oxygen or hydrogen are in the burner 1, the conduit 24 as well as the rapid heating unit 32. Furthermore, uncontrolled reactions with residual gases, such as air, can be prevented.

After a prescribed rinsing time, the mass flow controller 37 is closed. Hydrogen is now introduced via the mass flow controller 39 and the supply line 10 into the burner 1, whereby at least the combustion chamber 5 and possibly also partially the conduit 24 and the process chamber of the rapid heating unit 32 are filled with pure hydrogen. In this connection, the flow velocity of the hydrogen can be controlled as desired. After the combustion chamber is completely filled with hydrogen, the heating device 17 is activated and now oxygen is introduced into the combustion chamber 5 via the mass flow controller 38 and the second inlet line 12. The oxygen is introduced, for example, with a time delay of five seconds relative to the hydrogen. When the oxygen starts to exit from the outlet end 14 of the second inlet line 12, the oxygen is immediately ignited and is burned together with the hydrogen. In this connection, it is important that at this point in time the heating device 17 has already reached the required temperature in order to prevent the formation, in the combustion chamber 5, of a large quantity of oxyhydrogen gas or an explosive mixture of oxygen and hydrogen. For example, the heating device 17 heats the region at the outlet end 14 of the inlet line 12 to 700° C. During the combustion there results a flame that extends into the combustion chamber 5 and is detected by the UV detector.

The control unit 34 sets the flow of the hydrogen and of the oxygen into the combustion chamber 5 via the mass flow controllers 38 and 39 in such a way that more hydrogen is present than is necessary for the combustion of the oxygen, so that the oxygen is burned in a hydrogen-rich environment. Due to the combustion of the oxygen and of the hydrogen, there is produced in the combustion chamber 5 water vapor that, together with the excess hydrogen, is conveyed through the conduit 24 into the process chamber of the rapid heating unit 32. The process gas can be produced with a high flow of up to 30 slm (standard liters per minute), and is conveyed into the process chamber. As mentioned previously, there is disposed in the conduit 24 an oxygen sensor that detects the presence of unburned oxygen in the conduit 24. If unburned oxygen is detected in the conduit 24, the sensor emits a warning signal to the control unit 34 since oxygen in the conduit 24 together with the excess hydrogen can form an oxyhydrogen or explosive gas that upon introduction into the process chamber of the rapid heating unit 32 can explode and thus damage the wafer located therein and possibly also the process chamber itself. After the warning signal is received, the control unit 34 sends appropriate signals to the mass flow controllers 38 and 39 in order to close them and thus interrupt the production of process gas in the burner 1. Alternatively, or also in addition, inert gas can be introduced via the mass flow controller 37 into the burner 1 and into the conduit 24 in order to prevent the formation of oxyhydrogen or explosive gas in the burner 1 and to again flush the burner.

If no unburned oxygen is detected in the conduit 24, additional hydrogen can be introduced via the mass flow controller 41 and the line 63 into the process gas that is disposed in the conduit 24 and comprises water vapor and hydrogen, in order to increase the hydrogen content in the process gas to a desired value. Furthermore, to the extent that this is desired, a further gas can be introduced via the mass flow controller 36 into the process gas of water vapor and hydrogen. The thereby resulting process gas mixture is now introduced into the process chamber of the rapid heating unit 32 for the treatment of a semiconductor wafer. The process chamber of a process heating unit 32 is first flushed with the process gas before the thermal treatment of the wafer is started. For example, the process chamber is flushed with three times its own volume, which requires, for example, 60 seconds. Only then is the thermal treatment of the wafer disposed in the process chamber started. During the flushing, the wafer is at a low temperature of 20° C. to 560° C. in order to prevent a self-ignition of the process gas, which in the beginning can still be in an undefined composition. Furthermore, one wishes to prevent the wafer from already reacting with the not yet finally defined process gas. The upper temperature of the wafer depends upon the process and the type of wafer. For example, with metal-coated wafers the temperature can be less than 250° C., or even less than 100° C., in order to prevent oxidation or reaction processes in possibly undefined process gases. A hydrogen-rich wet oxidation, for example for the selective oxidation of gate-stacks with metal gates or metal gate contacts, can then be carried out in the process chamber.

If for the process in the rapid heating unit 32 it is necessary, after the hydrogen-rich process gas comprising water vapor and hydrogen, to provide an oxygen-rich process gas comprising water vapor and oxygen, the combustion of the oxygen in a hydrogen-rich atmosphere can be changed to a combustion in a hydrogen-poor atmosphere. For this purpose, the control unit 34 first activates the mass flow controllers 38 and 39 in such a way that oxygen and hydrogen in a stoichiometric ratio are introduced into the combustion chamber 5 of the burner 1. This results in a stoichiometric combustion, whereby pure water vapor is produced and no residual products remain. The stoichiometric combustion or burning is carried out until the excess hydrogen from the previous hydrogen-rich combustion is displaced from the combustion chamber 5 and possibly from the process chamber of the rapid heating unit. The quantity of oxygen introduced via the mass flow controller 38 can now be increased, so that an oxygen-rich combustion is effected, i.e. there is more oxygen present than can be burned with the hydrogen, so that a process gas comprising water vapor and oxygen is formed. This mixture of water vapor and oxygen can now be conveyed via the conduit 24 into the rapid heating unit 32. Furthermore, additional oxygen can be introduced via the mass flow controller 40 into the conduit 24 in order to increase the oxygen ratio in a desired manner in the process gas comprising water vapor and oxygen. In an analogous manner, it is also possible to change back from the production of an oxygen-rich process gas to the production of a hydrogen-rich process gas, whereby again an intermediate phase is provided whereby a stoichiometric combustion is effected in the combustion chamber 5.

It is, of course, also possible to start the burner 1 in such a way that it initially produces an oxygen-rich process gas and possibly subsequently is changed to the production of a hydrogen-rich process gas.

The process gas production portion 31 of the apparatus 30 is thus in a position to produce process gas comprising water vapor and selectively oxygen or hydrogen. By means of the mass flow controllers 40 and 41, any desired mixture ratio of water vapor to oxygen or of water vapor to hydrogen can be established in the process gas.

The control unit 34 is designed in such a way that it always locks the mass flow controllers 40 and 41 in opposition to one another, since the simultaneous introduction of hydrogen and oxygen into the conduit 24 would lead to the formation of an oxyhydrogen or explosive gas. Furthermore, it is also possible to mechanically couple the mass flow controllers 40, 41 in such a way that they are locked in opposition to one another, i.e. that always only one of the two mass flow controllers 40, 41 can be opened. The control unit 34 furthermore provides that the mass flow controller 40 is always closed if a hydrogen-rich combustion is effected in the burner 1, since also with the introduction of oxygen into a process gas comprising water vapor and hydrogen an oxyhydrogen or explosive gas would be produced. In an analogous manner, the mass flow controller 41 is controlled in such a way that it is always closed if an oxygen-rich combustion is effected in the burner 1.

To increase the safety, as already previously mentioned an oxygen and hydrogen sensor is provided in the conduit 24 for detecting unburned oxygen or unburned hydrogen respectively in the conduit. If after a hydrogen-rich combustion in the burner oxygen is detected in the conduit 24, this points to an error, and there exists the danger that oxyhydrogen or explosive gas if formed in the conduit 24 and/or the process chamber of the downstream rapid heating unit 32. Therefore, the appropriate sensor sends a warning signal to the control unit 34 that can interrupt the process and possibly introduce inert gas into the burner.

This is applicable in an analogous manner if after an oxygen-rich combustion in the burner 1 unburned hydrogen is detected in the conduit 24.

The apparatus 30 is now in a position to process a semiconductor wafer in the rapid heating unit 32 with a hydrogen-rich and/or oxygen rich process gas that contains water vapor. It is possible, during a single thermal treatment cycle, to switch between a hydrogen-rich and an oxygen-rich process gas that contains water vapor. It is, of course, also possible to switch multiple times between these two process gases during a thermal treatment cycle. A switching-over can also be effected within a process chamber between successive thermal treatment cycles.

The apparatus was previously described with the aid of a preferred embodiment of the invention, without, however, being limited to the specific embodiment. For example, the process gas production portion 31 can be connected to a plurality of rapid heating units 32 (or in general process chambers for the processing of semiconductor wafers) that are supplied in parallel with the same or sequentially with the same or different process gas mixtures. For example, one rapid heating unit could respectively require an oxygen-rich process gas that contains water vapor, whereas in the other rapid heating unit respectively a hydrogen-rich process gas that contains water vapor is required. The burner 1 could thus be sequentially used for both units without the necessity for having to shut down the burner between the supply of the one unit and the other unit, and possibly having to rinse the burner with inert gas, since one can change as desired between the production of an oxygen-rich and a hydrogen-rich process gas that contains water vapor. The burner can be operated at overpressure or underpressure, whereby an operation at underpressure is advantageous since gas is conveyed to the outlet by the underpressure in the combustion chamber. Operating in this manner again leads to a uniform burning condition.

The present invention also encompasses embodiments that result from the combination and/or the interchange of features of the previously described examples. It should furthermore be noted that instead of a semiconductor or a substrate, any desired object can be processed with the process gas produced pursuant to the method or apparatus of the present invention, whereby the processing is not limited exclusively to thermal, i.e. temperature-time, treatment cycles.

In apparatus in which the object is heated, for example, via electro-magnetic radiation, radiated power-time treatment cycles can also be involved.

The specification incorporates by reference the disclosure of German priority document 101 19 741.1 filed Apr. 23, 2001 and PCT/EP02/04345 filed Apr. 19, 2002.

The present invention is, of course, in no way restricted to the specific disclosure of the specification and drawings, but also encompasses any modifications within the scope of the appended claims.

The invention claimed is:

1. A method of treating objects, including the steps of:
providing a combustion chamber;
producing a first hydrogen-rich process gas of water vapor and hydrogen in said chamber by burning oxygen in an overstoichiometric, hydrogen-rich environment in said combustion chamber; and
conveying said first process gas into an object-treatment chamber.

2. A method according to claim 1, which includes the further step of detecting a presence of unburned oxygen downstream of said combustion chamber.

3. A method according to claim 2, which includes the further step of interrupting the method if unburned oxygen is detected downstream of said combustion chamber.

4. A method according to claim 2, which includes the further step of introducing an inert gas into said first process gas if unburned oxygen is detected downstream of said combustion chamber.

5. A method according to claim 1, which includes the further step of introducing hydrogen into said first process gas downstream of said combustion chamber.

6. A method according to claim 1, wherein prior to burning of the oxygen, said combustion chamber is filled with pure hydrogen, and wherein oxygen is introduced for the first time for triggering the burning.

7. A method according to claim 1, wherein to produce a second, oxygen-rich process gas, a ratio of oxygen to hydrogen in said combustion chamber is changed during the burning.

8. A method according to claim 7, wherein during the changing between a production of the hydrogen-rich process gas and the oxygen-rich process gas, a stoichiometric burning of oxygen and hydrogen is carried out for a predetermined period of time.

9. A method according to claim 8, which during a production of the oxygen-rich process gas, includes the step of detecting a presence of unburned hydrogen downstream of said combustion chamber.

10. A method according to claim 9, which includes the step of interrupting the method if unburned hydrogen is detected downstream of said combustion chamber.

11. A method according to claim 9, which includes the step of introducing an inert gas into the process gas if unburned hydrogen is detected downstream of said combustion chamber.

12. A method according to claim 7, which includes the step of introducing additional oxygen downstream of said combustion chamber after a production of the oxygen-rich process gas.

13. A method according to claim 1, which includes the step of blocking an oxygen supply line downstream of said combustion chamber if a hydrogen-rich process gas is produced in said combustion chamber.

14. A method according to claim 1, which includes the step of blocking a hydrogen supply line downstream of said combustion chamber if an oxygen-rich process gas is produced in said combustion chamber.

15. A method according to claim 1, which includes the step of introducing a further fluid into said first process gas downstream of said combustion chamber.

16. A method according to claim 1, wherein an oxygen-rich process gas is initially produced in said combustion chamber by burning oxygen in a hydrogen-poor environment, and wherein a ratio of oxygen to hydrogen in said combustion chamber is changed for burning the oxygen in the hydrogen-rich environment.

17. A method according to claim 16, wherein during a change from the burning of oxygen in the hydrogen-poor environment to the hydrogen-rich environment, a stoichiometric burning of oxygen and hydrogen is carried out for a predetermined period of time.

18. A method according to claim 1, which includes the step of flushing said combustion chamber with an inert gas prior to the burning process.

19. A method according to claim 1, wherein said first process gas is used for a thermal treatment of at least one semiconductor wafer, and wherein within a treatment cycle a change is made between the hydrogen-rich process gas and an oxygen-rich process gas.

20. A method according to claim 19, wherein a concentration of hydrogen or oxygen in said process gas is changed during a thermal treatment cycle.

21. A method according to claim 1, wherein said first process gas is used for a thermal treatment of at least one semiconductor wafer, and wherein during successive thermal treatment cycles, a change is made between the hydrogen-rich and an oxygen-rich process gas.

22. A method according to claim 21, wherein a concentration of hydrogen or oxygen in said process gas is changed during a thermal treatment cycle.

23. An apparatus for the treatment of objects and for the production of a process gas for the treatment of the objects, comprising:
at least one process chamber for the thermal treatment of objects;
a burner;
a combustion chamber provided in said burner;
at least one oxygen supply line, and at least one hydrogen supply line, into said combustion chamber;
an ignition unit for igniting an oxygen/hydrogen mixture in said combustion chamber;
a control unit that is controllable in such a way that for a formation of a process gas comprising water vapor and hydrogen, oxygen is ignited in an overstoichiometric, hydrogen-rich environment and is completely burned; and an outlet conduit that communicates with said burner, wherein said outlet conduit is connected to at least one of said at least one process chamber.

24. An apparatus according to claim 23, wherein at least one of an oxygen sensor and a hydrogen sensor are disposed in said outlet conduit of said burner.

25. An apparatus according to claim 23, wherein a hydrogen line is connected with said outlet conduit of said burner.

26. An apparatus according to claim 25, wherein an oxygen line communicates with said outlet conduit of said burner.

27. An apparatus according to claim 26, wherein means are provided for locking said oxygen line and said hydrogen line in opposition to one another.

28. An apparatus according to claim 23, wherein said control unit is controllable in such a way that a combustion in said combustion chamber is changed from a hydrogen-rich combustion to an oxygen-rich combustion.

* * * * *